US006919669B2

(12) United States Patent
Bryant et al.

(10) Patent No.: US 6,919,669 B2
(45) Date of Patent: Jul. 19, 2005

(54) ELECTRO-ACTIVE DEVICE USING RADIAL ELECTRIC FIELD PIEZO-DIAPHRAGM FOR SONIC APPLICATIONS

(75) Inventors: Robert G. Bryant, Lightfoot, VA (US); Robert L. Fox, Hayes, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 80 days.

(21) Appl. No.: 10/392,491

(22) Filed: Mar. 12, 2003

(65) Prior Publication Data

US 2003/0173874 A1 Sep. 18, 2003

Related U.S. Application Data

(60) Provisional application No. 60/365,014, filed on Mar. 15, 2002.

(51) Int. Cl.[7] .......................... H01L 41/08; H01L 41/04

(52) U.S. Cl. ........................ 310/366; 310/365; 310/369

(58) Field of Search ................................. 310/364–369

(56) References Cited

U.S. PATENT DOCUMENTS

| | | | | |
|---|---|---|---|---|
| 2,410,113 A | | 10/1946 | Turner, Jr. | 367/168 |
| 2,540,187 A | | 2/1951 | Cherry, Jr. | 310/358 |
| 2,540,194 A | | 2/1951 | Ellett | 310/331 |
| 2,836,737 A | | 5/1958 | Crownover | 310/831 |
| 2,836,738 A | | 5/1958 | Crownover | 310/328 |
| 2,895,062 A | | 7/1959 | Abbott | 310/334 |
| 2,967,956 A | | 1/1961 | Dranetz et al. | 310/330 |
| 3,114,849 A | * | 12/1963 | Poschenrieder | 310/330 |
| 3,215,078 A | | 11/1965 | Stec | 417/322 |
| 3,457,543 A | | 7/1969 | Akervold et al. | 367/155 |
| 3,510,698 A | | 5/1970 | Massa | 310/330 |
| 3,609,416 A | | 9/1971 | Epstein | 310/313 B |
| 3,832,580 A | | 8/1974 | Yamamuro et al. | 310/328 |
| 3,978,353 A | | 8/1976 | Kinoshita | 310/317 |
| 4,051,455 A | | 9/1977 | Fowler | 367/155 |
| 4,284,921 A | | 8/1981 | Lemonon et al. | 310/328 |
| 4,401,911 A | | 8/1983 | Ravinet et al. | 310/334 |
| 4,409,681 A | | 10/1983 | White | 367/166 |

(Continued)

OTHER PUBLICATIONS

Hari Singh Nalwa, "Ferroelectric Polymers; Chemistry, Physics, and Applications," Marcel Dekker, Inc., p. 710–711.

(Continued)

*Primary Examiner*—Tom Dougherty
*Assistant Examiner*—J. Aguirrechea
(74) *Attorney, Agent, or Firm*—Kurt G. Hammerle

(57) ABSTRACT

An electro-active transducer for sonic applications includes a ferroelectric material sandwiched by first and second electrode patterns to form a piezo-diaphragm coupled to a mounting frame. When the device is used as a sonic actuator, the first and second electrode patterns are configured to introduce an electric field into the ferroelectric material when voltage is applied to the electrode patterns. When the device is used as a sonic sensor, the first and second electrode patterns are configured to introduce an electric field into the ferroelectric material when the ferroelectric material experiences deflection in a direction substantially perpendicular thereto. In each case, the electrode patterns are designed to cause the electric field to: i) originate at a region of the ferroelectric material between the first and second electrode patterns, and ii) extend radially outward from the region of the ferroelectric material (at which the electric field originates) and substantially parallel to the plane of the ferroelectric material. The mounting frame perimetrically surrounds the peizo-diaphragm and enables attachment of the piezo-diaphragm to a housing.

27 Claims, 13 Drawing Sheets

U.S. PATENT DOCUMENTS

| | | | | |
|---|---|---|---|---|
| 4,452,084 A | | 6/1984 | Taenzer | 73/609 |
| 4,518,889 A | | 5/1985 | 'T Hoen | 310/357 |
| 4,525,645 A | | 6/1985 | Shirley et al. | 310/337 |
| 4,581,556 A | | 4/1986 | Yamamoto | 310/320 |
| 4,695,988 A | | 9/1987 | Banno | 367/154 |
| 4,697,195 A | | 9/1987 | Quate et al. | 347/146 |
| 4,803,393 A | | 2/1989 | Takahashi | 310/328 |
| 4,823,041 A | | 4/1989 | Inoue et al. | 310/322 |
| 4,865,042 A | | 9/1989 | Umemura et al. | 600/439 |
| 4,944,659 A | | 7/1990 | Labbe et al. | 417/413.2 |
| 5,081,995 A | | 1/1992 | Lu et al. | 600/459 |
| 5,122,993 A | | 6/1992 | Hikita et al. | 367/155 |
| 5,291,090 A | | 3/1994 | Dias | 310/334 |
| 5,327,041 A | | 7/1994 | Culp | 310/328 |
| 5,374,863 A | | 12/1994 | Mochizuki et al. | 310/313 D |
| 5,503,034 A | | 4/1996 | Amano et al. | 73/862.473 |
| 5,592,042 A | | 1/1997 | Takuchi et al. | 310/328 |
| 5,631,040 A | | 5/1997 | Takuchi et al. | 427/100 |
| 5,663,505 A | | 9/1997 | Nakamura | 73/702 |
| 5,697,195 A | | 12/1997 | Maylon | 52/344 |
| 5,838,350 A | | 11/1998 | Newcombe et al. | 347/68 |
| 5,862,275 A | | 1/1999 | Takeuchi et al. | 385/19 |
| 5,991,239 A | | 11/1999 | Fatemi-Booshehri et al. | 367/164 |
| 6,025,671 A | | 2/2000 | Boecking | 310/369 |
| 6,033,191 A | | 3/2000 | Kamper et al. | 417/322 |
| 6,042,345 A | | 3/2000 | Bishop et al. | 417/322 |
| 6,069,433 A | | 5/2000 | Lazarus et al. | 310/333 |
| 6,071,087 A | | 6/2000 | Jalink, Jr. et al. | 417/322 |
| 6,071,088 A | | 6/2000 | Bishop et al. | 417/332 |
| 6,072,267 A | | 6/2000 | Atsuta | 310/323.06 |
| 6,074,178 A | | 6/2000 | Bishop et al. | 417/322 |
| 6,091,182 A | | 7/2000 | Takeuchi et al. | 310/330 |
| 6,106,245 A | | 8/2000 | Cabuz | 417/322 |
| 6,291,928 B1 | | 9/2001 | Lazarus et al. | 310/328 |
| 6,297,578 B1 | | 10/2001 | Takeuchi et al. | 310/330 |
| 6,323,580 B1 | * | 11/2001 | Bernstein | 310/324 |
| 6,341,732 B1 | | 1/2002 | Martin et al. | 239/4 |
| 6,351,196 B1 | | 2/2002 | Nakamura et al. | 333/195 |
| 6,353,277 B1 | | 3/2002 | Hahn-Jose | 310/324 |
| 6,356,007 B1 | | 3/2002 | Silva | 310/331 |
| 6,361,196 B1 | | 3/2002 | Boucheron et al. | 333/195 |

OTHER PUBLICATIONS

Shinichi Sakai et al, Presented at the 78th Convention of the Audio Engineering Society, "Digital–to–analog Conversion by Piezoelectric Headphone," AES, p. 1–18, ( May 3, 1985).

R. G. Bryant et al, Proceedings, Actuator 2002, Paper A1.3, "Radial Field Piezoelectric Diaphragms," 6 pages, ( Jun. 10, 2002).

R. G. Bryant et al, Presented at The First World Congress on Biomimetics and Artificial Muscles, Albuquerque NM, "The Effect of Radial Electric Fields on Piezoceramics and the Application of these Devices," 6 pages, ( Dec. 9, 2002).

* cited by examiner

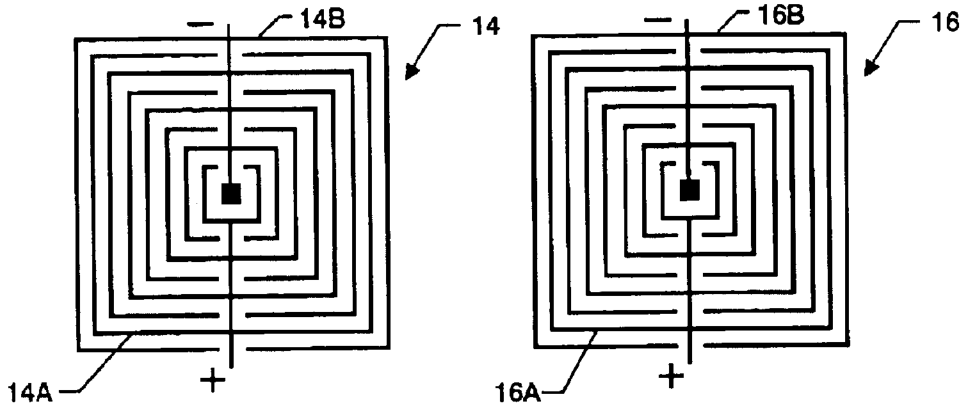
FIG. 16A
FIG. 16B
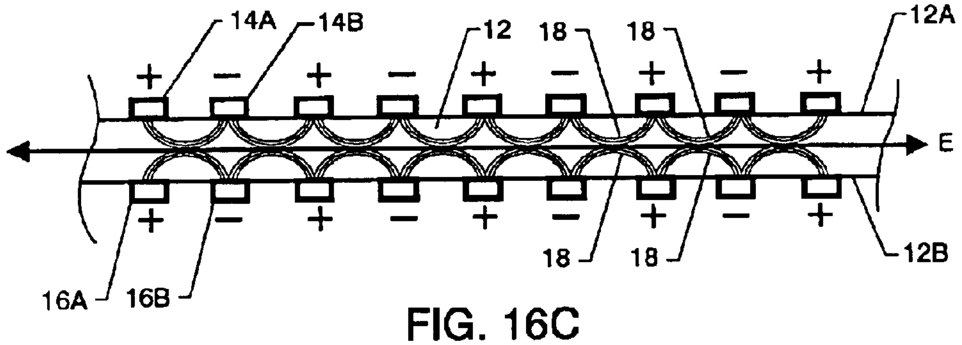
FIG. 16C
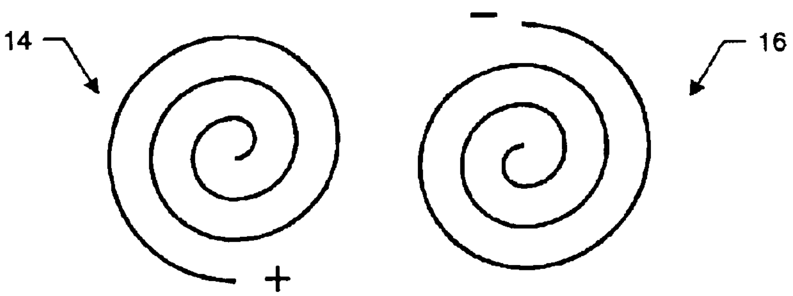
FIG. 17A
FIG. 17B
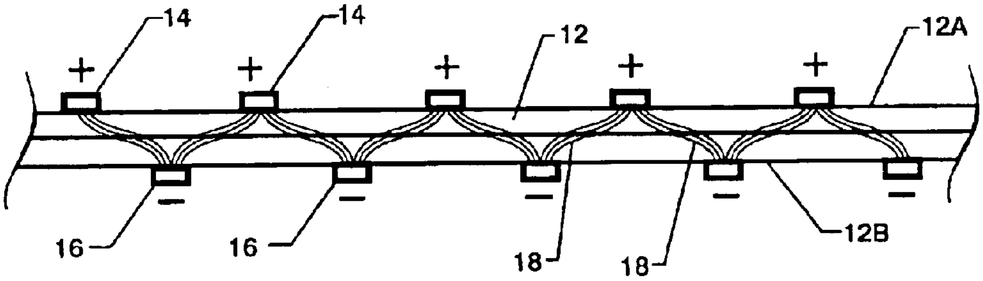
FIG. 17C

ELECTRO-ACTIVE DEVICE USING RADIAL ELECTRIC FIELD PIEZO-DIAPHRAGM FOR SONIC APPLICATIONS

CROSS-REFERENCE TO RELATED PATENT APPLICATIONS

This patent application is co-pending with one related patent application entitled "ELECTRO-ACTIVE TRANSDUCER USING RADIAL ELECTRIC FIELD TO PRODUCE/SENSE OUT-OF-PLANE TRANSDUCER MOTION", Ser. No. 10/347,563, filed Jan. 16, 2003, and owned by the same assignee as this patent application.

ORIGIN OF THE INVENTION

The invention described herein was made by employees of the United States Government and may be manufactured and used by or for the Government for governmental purposes without the payment of any royalties thereon or therefor. Pursuant to 35 U.S.C. §119, the benefit of priority from provisional application No. 60/365,014, with a filing date of Mar. 15, 2002, is claimed for this non-provisional application.

BACKGROUND OF THE INVENTION

1. Field of the Invention

This invention relates to sonic transducers. More specifically, the invention is an electro-active device for acoustic applications comprising a piezo-diaphragm that undergoes out-of plane deflection when a radial electric field is induced in the plane of the piezo-diaphragm.

2. Description of the Related Art

Sonic transducers such as loudspeakers, hydrophones, and microphones made from active piezo-elements typically require the mounting of these piezo-elements to hold them in place for directed mechanical action and electrical contact. In general, the mounting affects the performance of the device because it becomes an integral part of the piezo-element. More specifically, the mounting influences the piezo-element by restricting its movement and changing the mechanical resonance frequency and response of the piezo-element. Additionally, the mounting fixture and any additional mechanical elements are subjected to mechanical fatigue as the piezo-element vibrates and exerts mechanical strain on the fixture.

SUMMARY OF THE INVENTION

In accordance with the present invention, an electro-active sonic transducer includes at least one piece of ferroelectric material defining a first surface and a second surface opposing the first surface. The first and second surfaces lie in substantially parallel planes. A first electrode pattern is coupled to the first surface and a second electrode pattern is coupled to the second surface. When used as a sonic actuator such as a loudspeaker, the first and second electrode patterns are configured to introduce an electric field into the ferroelectric material when voltage is applied to the electrode patterns. The electrode patterns are designed to cause the electric field to: i) originate at a region of the ferroelectric material between the first and second electrode patterns, and ii) extend radially outward from the region of the ferroelectric material (at which the electric field originates) and substantially parallel to the parallel planes defined by the ferroelectric material. As a result, the ferroelectric material deflects symmetrically about the region of the ferroelectric material at which the electric field originates. In other words, the ferroelectric material deflects in a radially symmetric fashion and in a direction that is substantially perpendicular to the electric field.

When used as a sonic sensor such as a hydrophone or microphone, the first and second electrode patterns are configured to produce an induced electric field in the ferroelectric material when the ferroelectric material experiences deflection in a direction substantially perpendicular to the first and second surfaces. The induced electric field originates at the region of the ferroelectric material between the first and second electrode patterns and extends radially outward from the region substantially parallel to the first and second surfaces. As a result, a current is induced in each of the first and second electrode patterns, with the current being indicative of the deflection.

The ferroelectric material and first and second electrode patterns combine to form a piezo-diaphragm. A region for attaching, made in one embodiment of dielectric material, is coupled to the piezo-diaphragm and extends radially outward about the outer perimeter of the piezo-diaphragm. That is, the region perimetrically borders the piezo-diaphragm. A housing may be connected to the region. Because the piezo-diaphragm may be attached mechanically around its perimeter without impacting the strain behavior of the ferroelectric material, the piezo-diaphragm reduces the addition of mechanical resonance or vibration to the loudspeaker, hydrophone, or microphone during operation of the invention.

BRIEF DESCRIPTION OF THE DRAWINGS

FIG. 16A is an isolated view of an upper electrode pattern using square interdigitated ring electrodes;

FIG. 16B is an isolated view of a lower electrode pattern using square interdigitated ring electrodes;

FIG. 16C is a cross-sectional view of a portion of the piezo-diaphragm having the upper and lower electrode patterns depicted in FIGS. 16A and 16B;

FIG. 17A is an isolated view of an upper electrode pattern using a spiraling electrode;

FIG. 17B is an isolated view of a lower electrode pattern using a spiraling electrode;

FIG. 17C is a cross-sectional view of a portion of the piezo-diaphragm having the upper and lower electrode patterns depicted in FIGS. 17A and 17B;

DETAILED DESCRIPTION OF THE INVENTION

Figure 1:
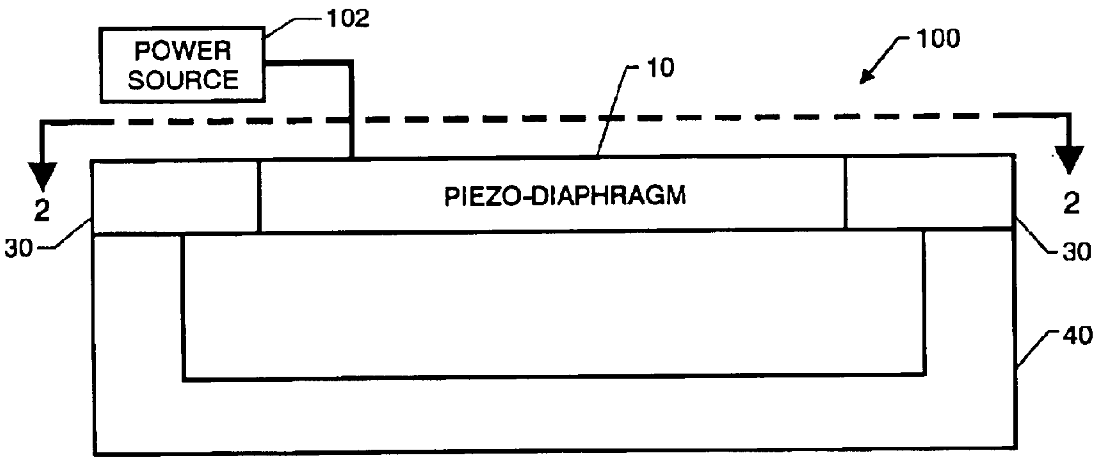
FIG. 1 is a schematic side view of a sonic transducer mounted to a housing in accordance with the present invention.
Figure 2A:
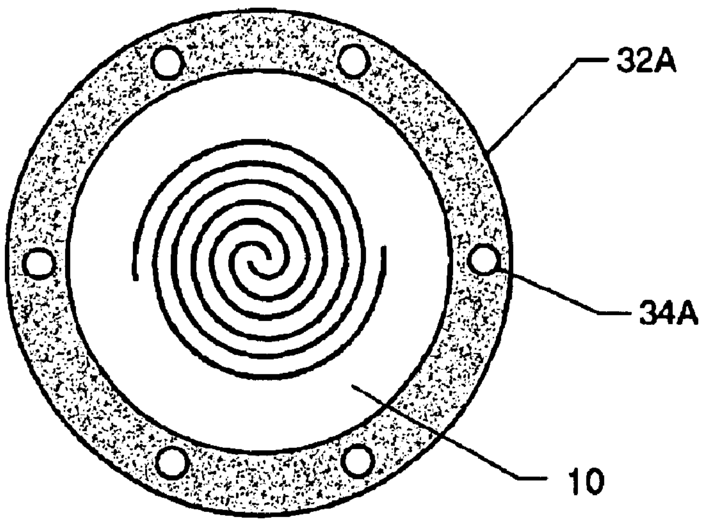
FIG. 2A is a plan view taken along line 2—2 of FIG. 1 showing one embodiment of the present invention having a circular mounting frame.
Figure 2B:
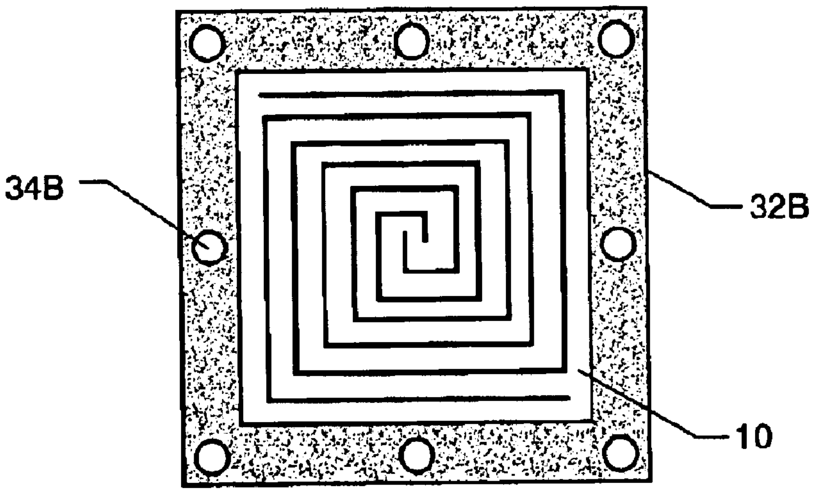
FIG. 2B is a plan view taken along line 2—2 of FIG. 1 showing another embodiment of the present invention having a rectangular mounting frame.
Figure 3A:
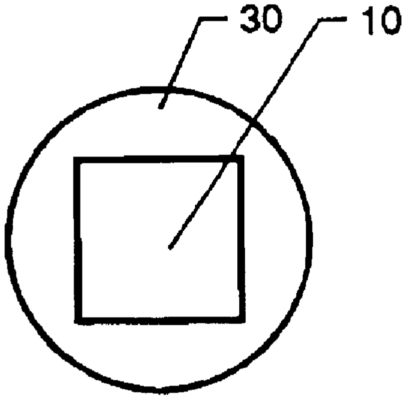
FIG. 3A is a plan view taken along line 2—2 of FIG. 1 showing another embodiment of the present invention having a rectangular piezo-diaphragm and a circular mounting frame.
Figure 3B:
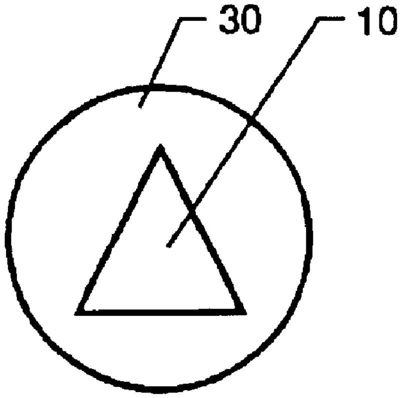
FIG. 3B is a plan view taken along line 2—2 of FIG. 1 showing another embodiment of the present invention having a triangular piezo-diaphragm and a circular mounting frame.

Referring now to the drawings, and more particularly to FIG. 1, a top-level schematic drawing of one embodiment of an electro-active device for sonic applications in accordance with the present invention is shown and referenced generally by numeral 100. Depending on its particular configuration, electro-active device 100 can function as an actuator or as a sensor. However, in each case, the work-performing structure thereof will be the same. More specifically, electro-active device 100 has a piezo-diaphragm 10 coupled with a means for attaching 30 the piezo-diaphragm about its perimeter to a housing 40. The means for attaching 30 may comprise a rigid mounting frame 32A, 32B as shown in FIGS. 2A and 2B with holes 34A, 34B for receiving a bolt, screw, rivet, etc. to connect the frame to a housing. The circumferential shapes of piezo-diaphragm 10 and means for attaching 30 can be tailored to suit a particular application. Further, piezo-diaphragm 10 and means for attaching region 30 can have their circumferential shapes correspond with one another or be different from one another. Several examples of possible geometries are illustrated in FIGS. 2A, 2B, 3A, and 3B. Examples of correspondence between the geometries of the piezo-diaphragm 10 and the mounting frame are illustrated in FIGS. 2A and 2B, whereas examples of differences therebetween are illustrated in FIGS. 3A and 3B.

Figure 4:
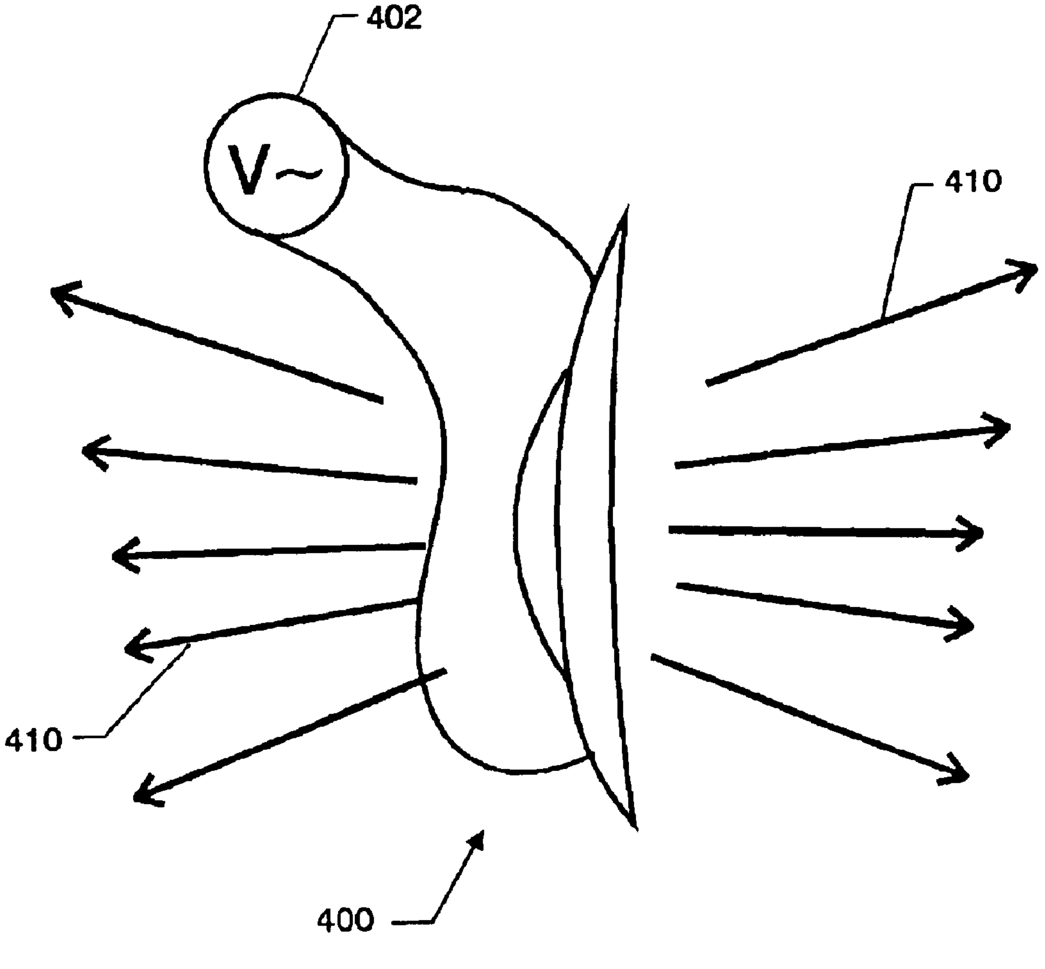
FIG. 4 is a side view of a sonic transducer functioning as a loudspeaker.

Because electro-active device 100 is a sonic transducer, it can function as either a sonic actuator or as sonic sensor. FIG. 4 illustrates a side view of electro-active device 400, which is functioning as a sonic actuator or loudspeaker. Device 400 is connected to a power supply 402 which provides a voltage to actuate movement of the piezo-diaphragm, thereby producing sound waves 410.

Figure 5:
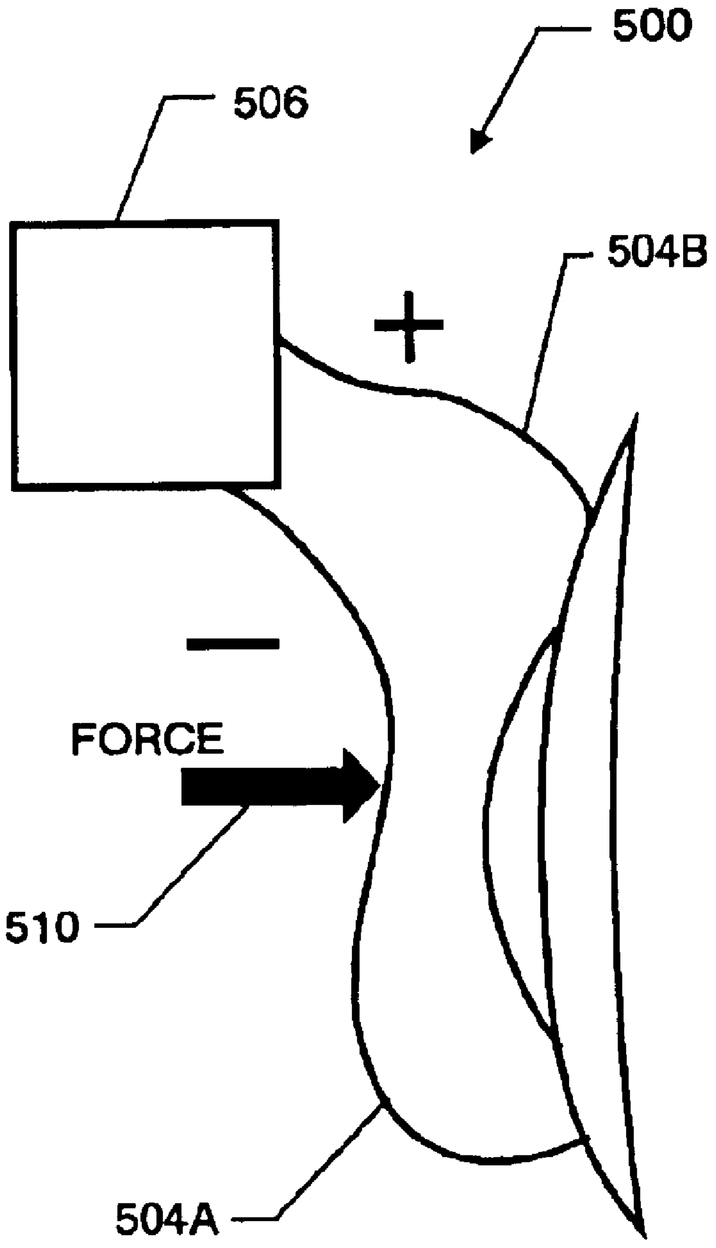
FIG. 5 is a side view of a sonic transducer functioning as a hydrophone or microphone.
Figure 6:
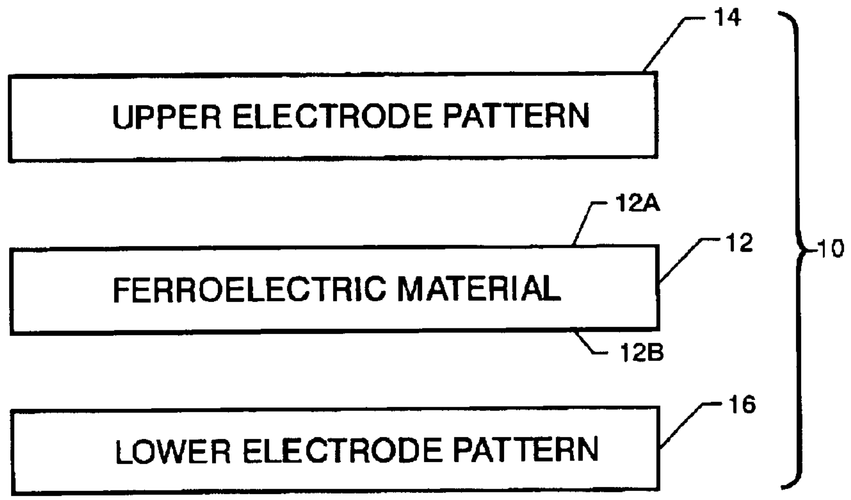
FIG. 6 is a schematic view of a piezo-diaphragm according to the present invention.

On the other hand, FIG. 5 shows a side view of electro-active device 500, which is functioning as a sonic sensor such as a hydrophone or microphone. Device 500 has electrical leads 504A, 504B which connect to an electronic system 506. The electronic system 506 analyzes the electrical signals or current generated by the piezo-diaphragm of device 500, thereby enabling measurement of the acoustic energy or force 510 incident upon device 500.

The common features between each of the above-described sonic transducers are that piezo-diaphragm 10 has a mounting region 30 mechanically coupled thereto for attachment to a housing 40. In these embodiments, the out-of-plane deflection experienced by piezo-diaphragm 10 is not constrained by housing 40 and does not mechanically strain housing 40. Thus, all mechanical work produced by piezo-diaphragm 10 when functioning as an actuator can be applied to the production of sound. Similarly, the acoustic energy or force incident upon piezo-diaphragm 10 when functioning as a sensor is dissipated primarily by the piezo-diaphragm 10, thereby increasing sensitivity of the sensor.

The construction of piezo-diaphragm 10 is described in the cross-referenced U.S. patent application Ser. No. 10/347,563, the contents of which are hereby incorporated by reference. For a complete understanding of the present invention, the description of piezo-diaphragm 10 will be repeated herein. The essential elements of piezo-diaphragm 10 are a ferroelectric material 12 sandwiched between an upper electrode pattern 14 and a lower electrode pattern 16. More specifically, electrode patterns 14 and 16 are coupled to ferroelectric material 12 such that voltage applied to the electrode patterns is coupled to ferroelectric material 12 to generate an electric field as will be explained further below. Such coupling to ferroelectric material 12 can be achieved in any of a variety of well-known ways. For example, electrode patterns 14 and 16 could be applied directly to opposing surfaces of ferroelectric material 12 by means of vapor deposition, printing, plating, or gluing, the choice of which is not a limitation of the present invention.

Ferroelectric material 12 is any piezoelectric, piezorestrictive, electrostrictive (such as lead magnesium niobate lead titanate (PMN-PT)), pyroelectric, etc., material structure that deforms when exposed to an electrical field (or generates an electrical field in response to deformation as in the case of an electro-active sensor). One class of ferroelectric materials that has performed well in tests of the present invention is a ceramic piezoelectric material known as lead zirconate titanate, which has sufficient stiffness such that piezo-diaphragm 10 maintains a symmetric, out-of-plane displacement as will be described further below.

Figure 7:
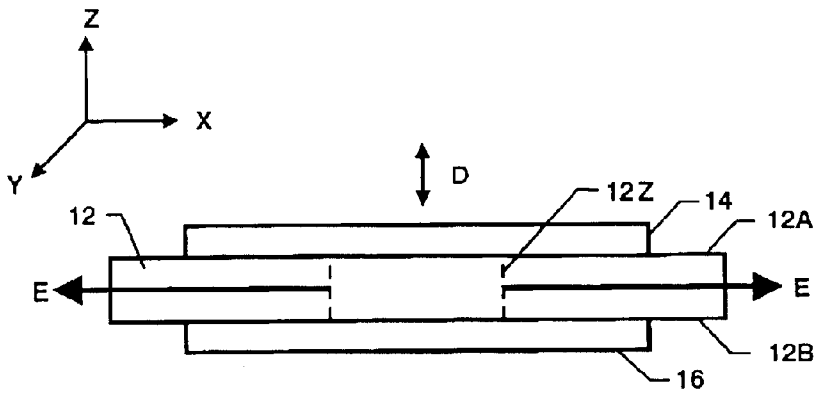
FIG. 7 is a side, schematic view of the piezo-diaphragm shown in FIG. 6 illustrating the radial electric field and out-of-plane displacement generated thereby.
Figure 8:
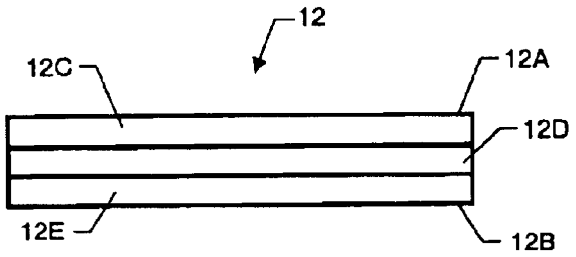
FIG. 8 is a side view of a layered construction of the piezo-diaphragm's ferroelectric material.
Figure 9:
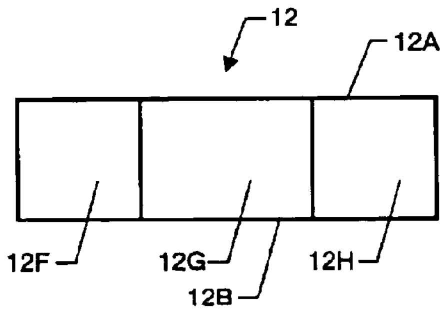
FIG. 9 is a side view of a piece-wise construction of the piezo-diaphragm's ferroelectric material.

Ferroelectric material 12 is typically a composite material where the term "composite" as used herein can mean one or more materials mixed together (with at least one of the materials being ferroelectric) and formed as a single sheet or monolithic slab with major opposing surfaces 12A and 12B lying in substantially parallel planes as best illustrated in the side view shown in FIG. 7. However, the term "composite" as used herein is also indicative of: i) a ferroelectric laminate made of multiple ferroelectric material layers such as layers 12C, 12D, 12E (FIG. 8) or ii) multiple ferroelectric pieces bonded together such as pieces 12F, 12G, 12H (FIG. 9). Note that in each case, major opposing surfaces 12A and 12B are defined for ferroelectric material 12.

In general, upper electrode pattern 14 is aligned with lower electrode pattern 16 such that, when voltages are applied thereto, a radial electric field E is generated in ferroelectric material 12 in a plane that is substantially parallel to the parallel planes defined by surfaces 12A and 12B, i.e., in the X-Y plane. More specifically, electrode patterns 14 and 16 are aligned on either side of ferroelectric material 12 such that the electric field E originates and extends radially outward in the X-Y plane from a region 12Z of ferroelectric material 12. The size and shape of region 12Z is determined by electrode patterns 14 and 16, a variety of which will be described further below.

The symmetric, radially-distributed electric field E mechanically strains ferroelectric material 12 along the Z-axis (perpendicular to the applied electric field E). This result is surprising and contrary to related art electro-active transducer or piezo-diaphragm teachings and devices. That is, it has been well-accepted in the transducer art that out-of-plane (i.e., Z-axis) displacement required an asymmetric electric field through the thickness of the active material. The asymmetric electric field introduces a global asymmetrical strain gradient in the material that, upon electrode polarity reversal, counters the inherent induced polarity through only part of the active material to create an in-situ bimorph. This result had been achieved by having electrodes on one side of the ferroelectric material. However, tests of the present invention have shown that displacement is substantially increased by using electrode patterns 14 and 16 that are aligned on both sides of ferroelectric material 12 such that the symmetric electric field E originates and extends both radially outward from region 12Z and throughout the thickness of the ferroelectric material.

Figures 10, 11, 12:
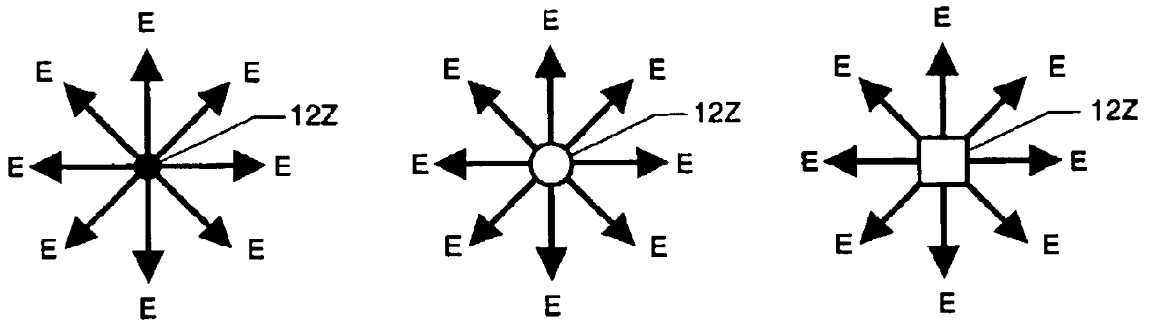
FIG. 10 is a diagrammatic view of a radial electric field originating from a point in the X-Y plane of the piezo-diaphragm's ferroelectric material.
FIG. 11 is a diagrammatic view of a radial electric field originating from the periphery of a circle in the X-Y plane of the piezo-diaphragm's ferroelectric material.
FIG. 12 is a diagrammatic view of a radial electric field originating from the periphery of a square in the X-Y plane of the piezo-diaphragm's ferroelectric material.

Electrode patterns 14 and 16 can define a variety of shapes (i.e., viewed across the X-Y plane) of region 12Z without departing from the scope of the present invention. For example, as shown in FIG. 10, region 12Z could be a point with radial electric field E extending radially outward therefrom. The periphery of region 12Z could also be a circle (FIG. 11) or a rectangle (FIG. 12) with radial electric field E extending radially outward therefrom. Other X-Y plane shapes (e.g., triangles, pentagons, hexagons, etc.) of region 12Z could also be defined without departing from the scope of the present invention.

In accordance with the present invention, radially-extending electric field E lies in the X-Y plane while displacement D occurs in the Z direction substantially perpendicular to surfaces 12A and 12B. Depending on how electric field E is applied, displacement D can be up or down along either the positive or negative Z-axis, but does not typically cross the X-Y plane for a given electric field. The amount of displacement D is greatest at the periphery of region 12Z where radial electric field E originates. The amount of displacement D decreases with radial distance from region 12Z with deflection of ferroelectric material 12 being symmetric about region 12Z. That is, ferroelectric material 12 deflects in a radially symmetric fashion and in a direction that is substantially perpendicular to surfaces 12A and 12B.

As mentioned above, a variety of electrode patterns can be used to achieve the out-of-plane or Z-axis displacement in the present invention. A variety of non-limiting electrode patterns and resulting local electric fields generated thereby will now be described with the aid of FIGS. 13–20 where the "A" figure depicts an upper electrode pattern 14 as viewed from above, the "B" figure depicts the corresponding lower electrode pattern 16 as viewed from below, and the "C" figure is a cross-sectional view of the ferroelectric material with the upper and lower electrode patterns coupled thereto and further depicts the resulting local electric fields generated by application of a voltage to the particular electrode patterns.

Figures 13A, 13B:
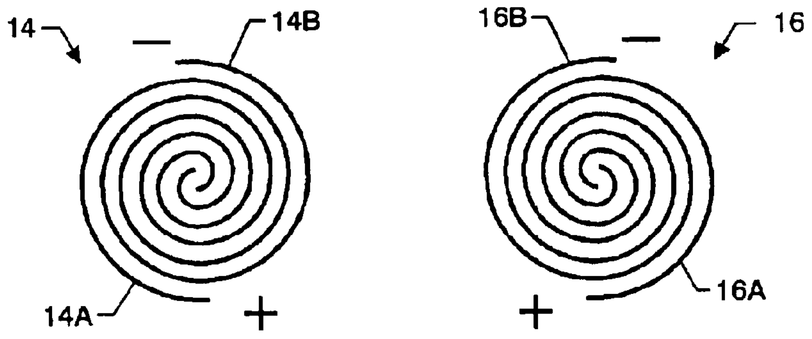
FIG. 13A is an isolated view of an upper electrode pattern using circular intercirculating electrodes.
FIG. 13B is an isolated view of a lower electrode pattern using circular intercirculating electrodes.
Figure 13C:
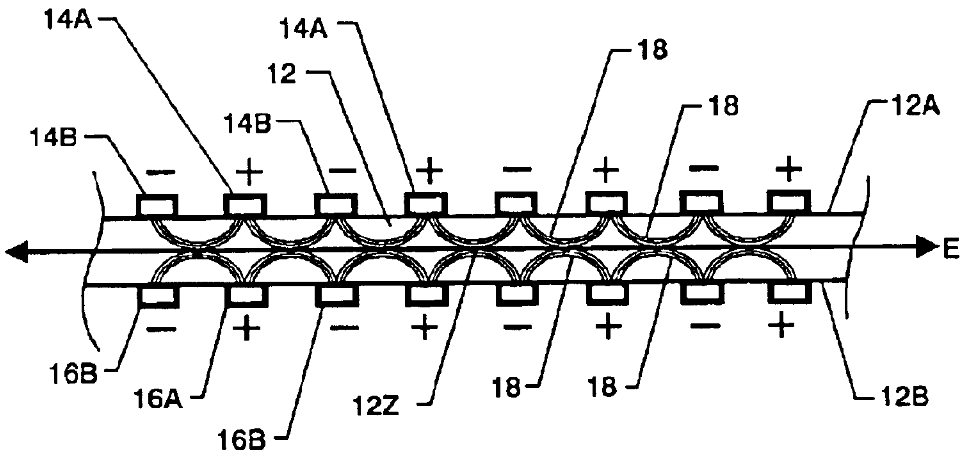
FIG. 13C is a cross-sectional view of a portion of the piezo-diaphragm having the upper and lower electrode patterns depicted in FIGS. 13A and 13B.

In FIGS. 13A–13C, upper electrode pattern 14 and lower electrode pattern 16 comprise intercirculating electrodes with electrodes 14A and 16A connected to one polarity and electrodes 14B and 16B connected to an opposing polarity. For illustrative purposes, electrodes 14A and 16A have a positive polarity applied thereto and electrodes 14B and 16B have a negative polarity applied thereto.

Patterns 14 and 16 are aligned such that they are a mirror image of one another as illustrated in FIG. 13C. The resulting local electric field lines are indicated by arced lines 18. In this example, the radial electric field E originates from a very small diameter region 12Z which is similar to the electric field illustrated in FIG. 10.

Figure 14A:
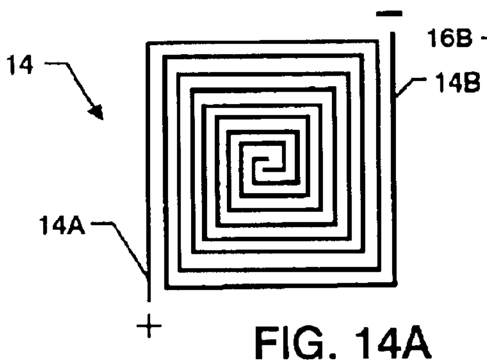
FIG. 14A is an isolated view of an upper electrode pattern using square intercirculating electrodes.
Figure 14B:
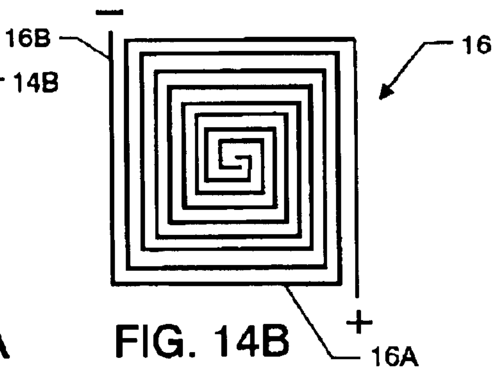
FIG. 14B is an isolated view of a lower electrode pattern using square intercirculating electrodes.
Figure 14C:
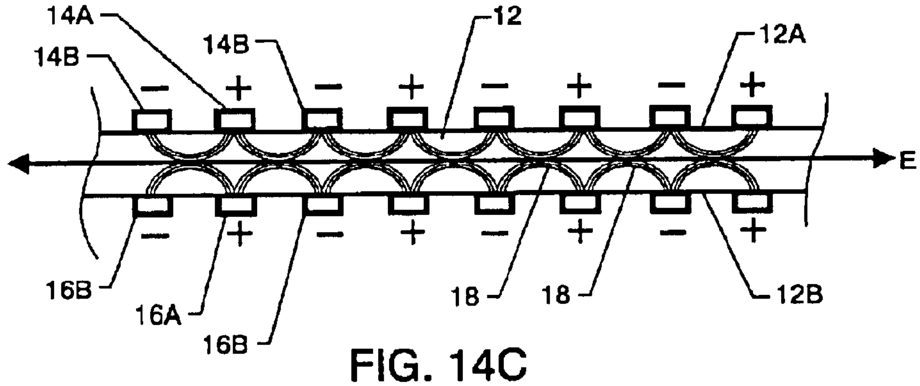
FIG. 14C is a cross-sectional view of a portion of the piezo-diaphragm having the upper and lower electrode patterns depicted in FIGS. 14A and 14B.

The spiraling intercirculating electrode pattern need not be based on a circle. For example, the intercirculating electrodes could be based on a square as illustrated in FIGS. 14A–14C. Other geometric intercirculating shapes (e.g., triangles, rectangles, pentagons, etc.) could also be used without departing from the scope of the present invention.

Figure 15A:
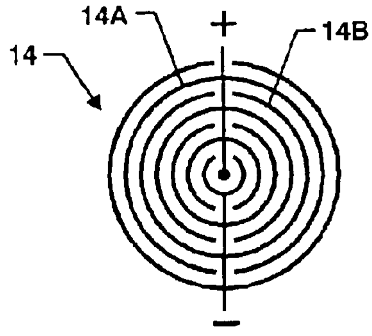
FIG. 15A is an isolated view of an upper electrode pattern using circular interdigitated ring electrodes.
Figure 15B:
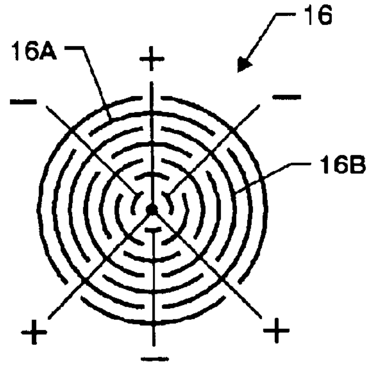
FIG. 15B is an isolated view of a lower electrode pattern using circular interdigitated ring electrodes.
Figure 15C:
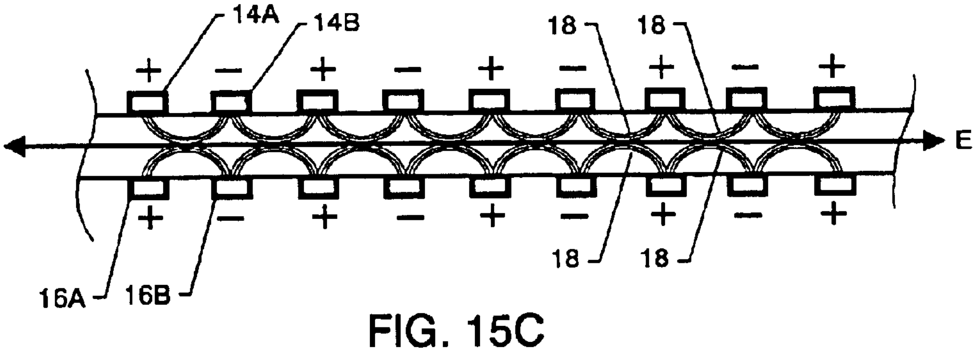
FIG. 15C is a cross-sectional view of a portion of the piezo-diaphragm having the upper and lower electrode patterns depicted in FIGS. 15A and 15B.
Figure 18A:
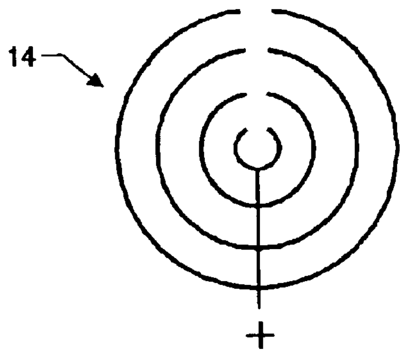
FIG. 18A is an isolated view of an upper electrode pattern using concentric ring electrodes.
Figure 18B:
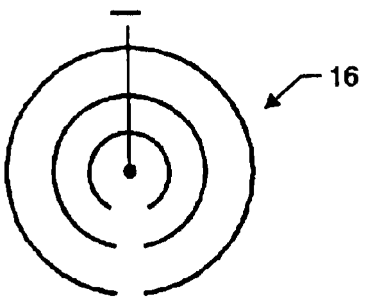
FIG. 18B is an isolated view of a lower electrode pattern using concentric ring electrodes.
Figure 18C:
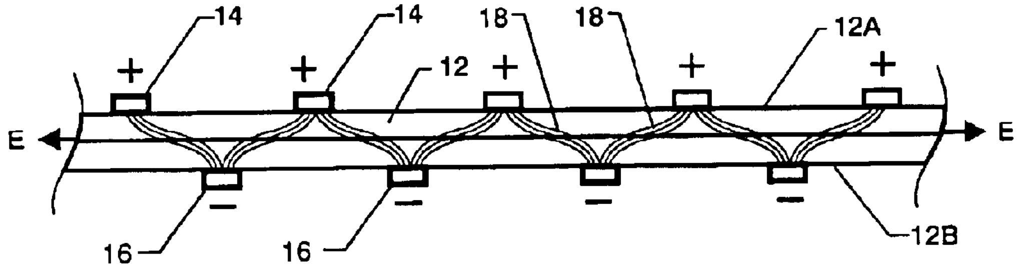
FIG. 18C is a cross-sectional view of a portion of the piezo-diaphragm having the upper and lower electrode patterns depicted in FIGS. 18A and 18B.

The electrode patterns may also be fabricated as interdigitated rings. For example, FIGS. 15A–15C depict circular-based interdigitated ring electrode patterns where upper and lower electrode patterns 14 and 16 are positioned to be aligned with one another in the Z-axis so that their polarities are aligned as shown in FIG. 15C. Once again, the interdigitated ring electrode patterns could be based on geometric shapes other than a circle. Accordingly, FIGS. 16A–16C depict square-based interdigitated ring electrode patterns as an example of another suitable geometric shape.

The upper and lower electrode patterns are not limited to mirror image or other aligned patterns. For example, FIGS. 17A–17C depict the use of spiraling electrodes in which upper and lower electrode patterns are staggered with respect to one another when viewed in the cross-section shown in FIG. 17C. Each electrode pattern is defined by a single polarity electrode pattern so that local electric field 18 extends between surfaces 12A and 12B of ferroelectric material 12. Note that the resulting staggered or cross pattern could be achieved by other electrode patterns such as the ring-based electrode patterns illustrated in FIGS. 18A–18C.

For applications requiring greater amounts of out-of-plane displacement D, the electrode patterns can be designed such that the induced radial electric field E enhances the localized strain field of the piezo-diaphragm. In general, this enhanced strain field is accomplished by providing an electrode pattern that complements the mechanical strain field of the piezo-diaphragm. One way of accomplishing this result is to provide a shaped piece of electrode material at the central portion of each upper and lower electrode pattern, with the shaped pieces of electrode materials having opposite polarity voltages applied thereto. The local electric field between the shaped electrode materials is perpendicular to the surfaces of the ferroelectric material, while the remainder of the upper and lower electrode patterns are designed so that the radial electric field originates from the aligned edges of the opposing-polarity shaped electrode materials.

Figure 19A:
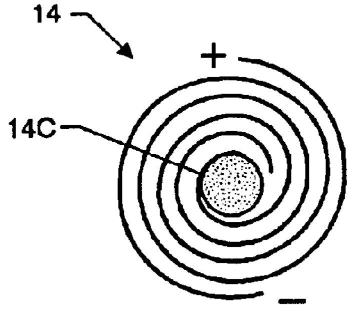
FIG. 19A is an isolated view of another upper electrode pattern based on intercirculating electrodes.
Figure 19B:
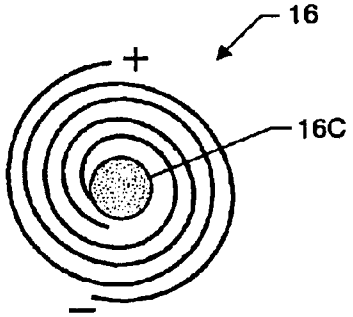
FIG. 19B is an isolated view of another lower electrode pattern based on intercirculating electrodes.
Figure 19C:
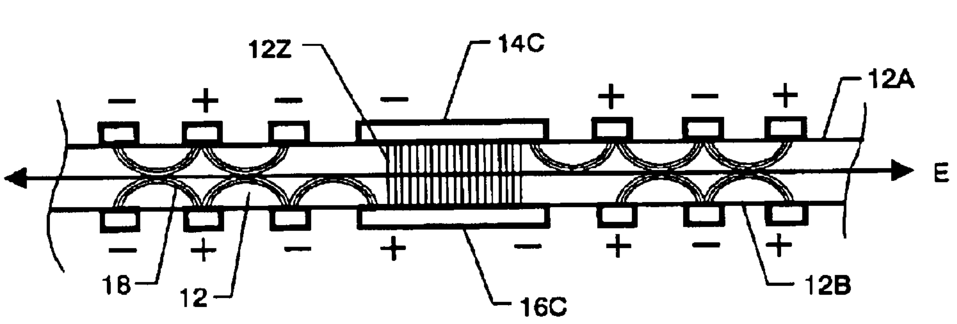
FIG. 19C is a cross-sectional view of a portion of the piezo-diaphragm having the upper and lower electrode patterns depicted in FIGS. 19A and 19B.

For example, FIGS. 19A–19C depict spiral-based intercirculating electrode patterns in which a shaped negative electrode 14C is aligned over a shaped positive electrode 16C at the center portions of upper electrode pattern 14 and lower electrode pattern 16. Under this embodiment, a circularly shaped region 12Z (aligned with the perimeters of electrodes 14C and 16C) is defined in ferroelectric material 12 with the radial electric field E extending radially outward therefrom. Note that such strain field enhancement is not limited to circularly-shaped electrodes 14C and 16C, as these shapes could be triangular, square, hexagonal, etc. Further, the remaining portions of the electrode patterns could be based on the above-described interdigitated ring or cross-pattern (staggered) electrode patterns.

Figure 20A:
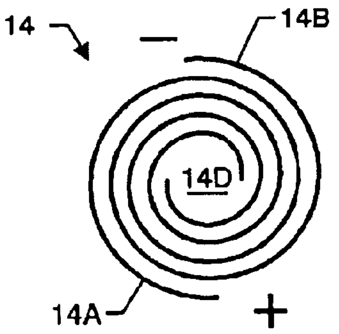
FIG. 20A is an isolated view of another embodiment of an electrode pattern based on intercirculating electrodes.
Figure 20B:
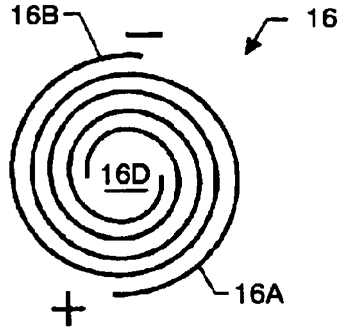
FIG. 20B is an isolated view of another embodiment of an electrode pattern based on intercirculating electrodes.
Figure 20C:
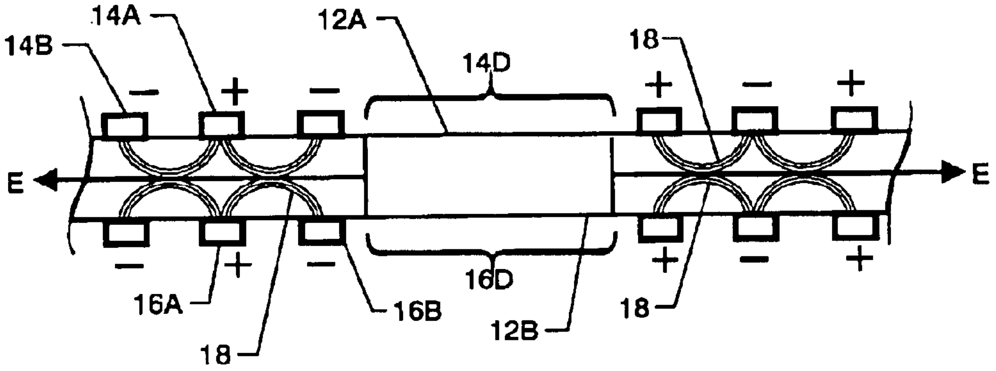
FIG. 20C is a cross-sectional view of a portion of the piezo-diaphragm having the upper and lower electrode patterns depicted in FIGS. 20A and 20B.

Enhancement of the piezo-diaphragm's local strain field could also be achieved by providing an electrode void or "hole" at the center portion of the electrode pattern so that the radial electric field essentially starts from a periphery defined by the start of the local electric fields. For example, FIGS. 20A–20C depict spiral-based intercirculating electrode patterns that define centrally-positioned upper and lower areas 14D and 16D, respectively, that are void of any electrodes. As a result, the induced radial electric field E originates at the points at which local electric field 18 begins, i.e., about the perimeter of aligned areas 14D and 16D. Once again, the central electrode void areas 14D and 16D are not limited to circular shapes, and the electrode patterns could be based on the above-described interdigitated ring or cross-pattern electrode patterns.

Figure 21:
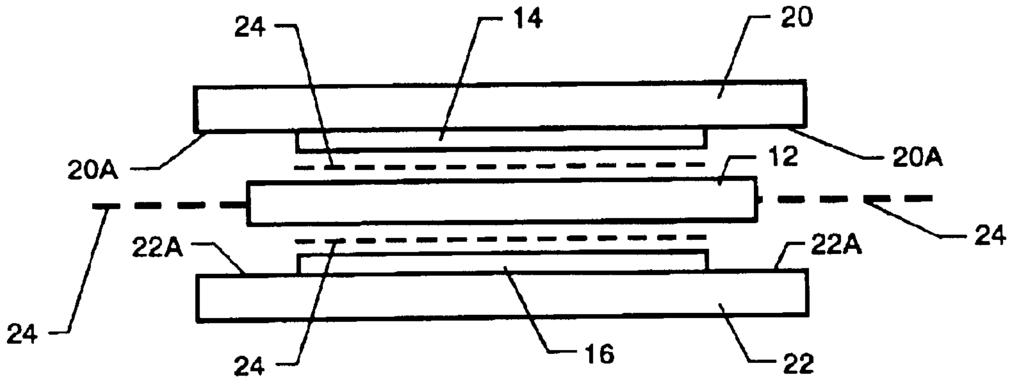
FIG. 21 is an exploded view of a piezo-diaphragm of the present invention encased in a dielectric material package.
Figure 22:
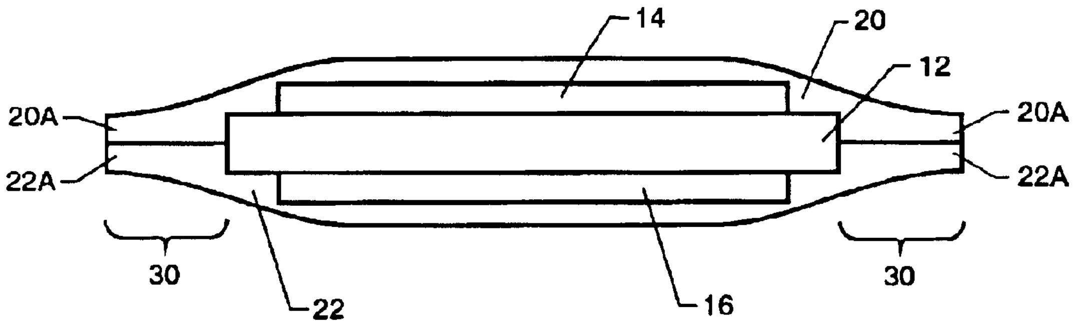
FIG. 22 is a side view of the piezo-diaphragm of FIG. 21 after construction thereof has been completed.

Regardless of the type of electrode pattern, construction of the piezo-diaphragm can be accomplished in a variety of ways. For example, the electrode patterns could be applied directly onto the ferroelectric material. Further, the piezo-diaphragm could be encased in a dielectric material to form the means for attaching (mounting region) 30 as well as waterproof or otherwise protect the piezo-diaphragm from environmental effects. By way of non-limiting example, one simple and inexpensive construction is shown in an exploded view in FIG. 21. Upper electrode pattern 14 is etched, printed, plated, or otherwise attached to a film 20 of a dielectric material. Lower electrode pattern 16 is similarly attached to a film 22 of the dielectric material. Films 20 and 22 with their respective electrode patterns are coupled to ferroelectric material 12 using a non-conductive adhesive referenced by dashed lines 24. Each of films 20 and 22 is larger than ferroelectric material 12 so that film portions 20A and 22A that extend beyond the perimeter of ferroelectric material 12 can be joined together using non-conductive adhesive 24. When the structure illustrated in FIG. 21 is pressed together, piezo-diaphragm 10 is encased in dielectric material 20/22 with portions 20A/22A forming mounting region 30 as illustrated in FIG. 22 (with the non-conductive adhesive being omitted for clarity of illustration).

Irrespective of the particular construction thereof, the present invention allows the work-producing piezo-diaphragm to be held in a fixture without strain on the piezo-diaphragm or the fixture. The devices can be fabricated using thin-film technology thereby making the present invention capable of being installed on circuit boards.

Figure 23:
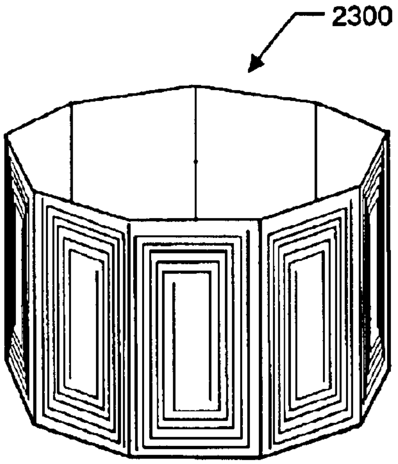
FIG. 23 is a perspective view of another embodiment of the present invention showing an array of sonic transducers.
Figure 25:
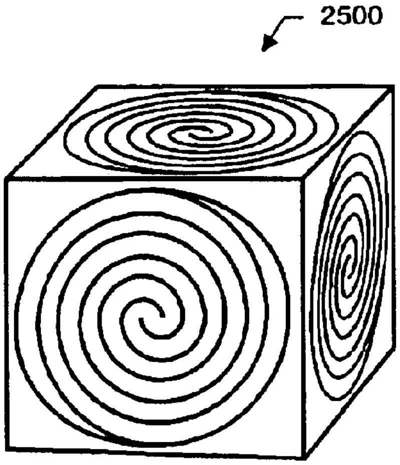
FIG. 25 shows another embodiment of the present invention having a three-axis directional transducer array.
Figure 24:
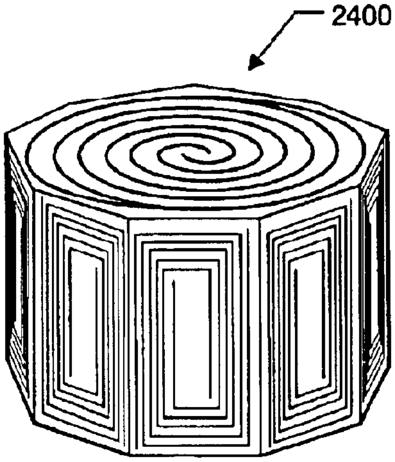
FIG. 24 shows another embodiment of the present invention having an omni-directional transducer array.
Figure 26:
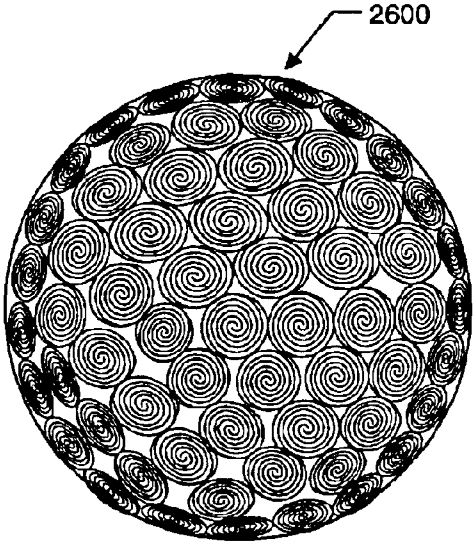
FIG. 26 shows another embodiment of the present invention having an omni-directional transducer array.

The present invention is not limited to a single electro-active transducer as has been described thus far. More specifically, the teachings of the present invention can be extended to a plurality of sonic transducers 100 functioning together in an array. Examples of such arrays include a two-dimensional, omni-directional transducer array 2300 as shown in FIG. 23, a three-dimensional, omni-directional transducer array 2400 as shown in FIG. 24, a three-axis directional array 2500 as shown in FIG. 25, and a spherical omni-directional transducer array 2600 as shown in FIG. 26.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A sonic transducer, comprising:

a ferroelectric material defining a first surface and a second surface opposing said first surface, wherein said first surface and said second surface lie in substantially parallel planes;

a first electrode pattern coupled to a portion of said first surface to define a first side of a piezo-diaphragm;

a second electrode pattern coupled to said second surface to define a second side of said piezo-diaphragm; and means, coupled to said piezo-diaphragm, for attaching said piezo-diaphragm about its perimeter to a housing, said means for attaching comprising a dielectric material, said means for attaching encasing said ferroelectric material with said first electrode pattern and second electrode pattern thereto, wherein said first electrode pattern and said second electrode pattern are configured to introduce an electric field into said ferroelectric material when said first electrode pattern and said second electrode pattern have voltage applied thereto, said electric field originating at a region of said ferroelectric material between said first electrode pattern and said second electrode pattern, said electric field extending radially outward from said region of said ferroelectric material and substantially parallel to said first surface and said second surface, whereby said ferroelectric material correspondingly deflects symmetrically about said region in a direction substantially perpendicular to said electric field, and wherein said first electrode pattern and said second electrode pattern are configured to produce an induced electric field in said ferroelectric material when said ferroelectric material experiences deflection in a direction substantially perpendicular to said first surface and said second surface, said induced electric field originating at said region of said ferroelectric material between said first electrode pattern and said second electrode pattern, said induced electric field extending radially outward from said region of said ferroelectric material and substantially parallel to said first surface and said second surface, whereby a current induced in each of said first electrode pattern and said second electrode pattern is indicative of said deflection.

2. A sonic transducer as in claim 1 wherein said piezo-diaphragm has a general shape selected from the group of shapes consisting of circles, triangles and polygons.

3. A sonic transducer as in claim 1 wherein said first electrode pattern and said second electrode pattern are mirror images of one another.

4. A sonic transducer as in claim 3 wherein each of said first electrode pattern and said second electrode pattern comprises at least two independent electrodes having opposite polarity and arranged in an alternating sequence as they extend radially outward from said region of said ferroelectric material, said alternating sequence being defined with respect to a cross-sectional view of said piezo-diaphragm.

5. A sonic transducer as in claim 1 wherein said first electrode pattern and said second electrode pattern are staggered with respect to one another along a direction substantially perpendicular to said substantially parallel planes, and wherein said first electrode pattern is energized with a voltage of a first polarity and said second electrode pattern is energized with a voltage of a second polarity that is opposite that of said first polarity.

6. A sonic transducer as in claim 1 further comprising a shaped electrode electrically coupled to a center portion each of said first electrode pattern and said second electrode pattern, wherein each said center portion is aligned with one another to define a common perimeter, wherein voltage applied to said center portion of said first electrode pattern is an opposite polarity with respect to voltage applied to said center portion of said second electrode pattern, and wherein said ferroelectric material aligned with said common perimeter defines said region of said ferroelectric material at which said electric field originates.

7. A sonic transducer as in claim 1 wherein said ferroelectric material comprises a single sheet of ferroelectric material.

8. A sonic transducer as in claim 1 wherein said means for attaching comprises:

a first piece of dielectric material with said first electrode pattern coupled thereto; and a second piece of dielectric material with said second electrode pattern coupled thereto;

said first piece of dielectric material joined to said second piece of dielectric material beyond the perimeter defined by said piezo-diaphragm to thereby form said means for attaching.

9. A sonic transducer as in claim 1 wherein said ferroelectric material comprises a ceramic piezoelectric material.

10. A sonic actuator comprising:

a ferroelectric material defining a first surface and a second surface opposing said first surface, wherein said first surface and said second surface lie in substantially parallel planes;

a first electrode pattern coupled to a portion of said first surface to define a first side of a piezo-diaphragm;

a second electrode pattern coupled to a portion of said second surface to define a second side of said piezo-diaphragm, wherein said first electrode pattern and said second electrode pattern are configured to introduce an electric field into said ferroelectric material when said first electrode pattern and said second electrode pattern have voltage applied thereto, said electric field originating at a region of said ferroelectric material between said first electrode pattern and said second electrode pattern, said electric field extending radially outward from said region of said ferroelectric material and substantially parallel to said first surface and said second surface, whereby said piezo-diaphragm correspondingly deflects symmetrically about said region in a direction substantially perpendicular to said electric field; and means, coupled to said piezo-diaphragm, for attaching said piezo-diaphragm about its perimeter to a housing, said means for attaching comprising a dielectric material, said means for attaching encasing said ferroelectric material with said first electrode pattern and second electrode pattern thereto.

11. A sonic actuator as in claim 10 wherein said piezo-diaphragm has a general shape selected from the group of shapes consisting of circles, triangles, and polygons.

12. A sonic actuator as in claim 10 wherein said first electrode pattern and said second electrode pattern are mirror images of one another.

13. A sonic actuator as in claim 12 wherein each of said first electrode pattern and said second electrode pattern comprises at least two independent electrodes having opposite polarity and arranged in an alternating sequence as they extend radially outward from said region of said ferroelectric material, said alternating sequence being defined with respect to a cross-sectional view of said piezo-diaphragm.

14. A sonic actuator as in claim 10 wherein said first electrode pattern and said second electrode pattern are staggered with respect to one another along a direction substantially perpendicular to said substantially parallel planes, and wherein said first electrode pattern is energized with a voltage of a first polarity and said second electrode pattern is energized with a voltage of a second polarity that is opposite that of said first polarity.

15. A sonic actuator as in claim 10 further comprising a shaped electrode electrically coupled to a center portion each of said first electrode pattern and said second electrode pattern, wherein each said center portion is aligned with one another to define a common perimeter, wherein voltage applied to said center portion of said first electrode pattern is an opposite polarity with respect to voltage applied to said center portion of said second electrode pattern, and wherein said ferroelectric material aligned with said common perimeter defines said region of said ferroelectric material at which said electric field originates.

16. A sonic actuator as in claim 10 wherein said ferroelectric material comprises a single sheet of ferroelectric material.

17. A sonic actuator as in claim 10 wherein said means for attaching comprises:

a first piece of dielectric material with said first electrode pattern coupled thereto; and a second piece of dielectric material with said second electrode pattern coupled thereto;

said first piece of dielectric material joined to said second piece of dielectric material beyond the perimeter defined by said piezo-diaphragm to thereby form said means for attaching.

18. A sonic actuator as in claim 10 wherein said ferroelectric material comprises a ceramic piezoelectric material.

19. A sonic sensor, comprising:

a ferroelectric material defining a first surface and a second surface opposing said first surface, wherein said first surface and said second surface lie in substantially parallel planes;

a first electrode pattern coupled to a portion of said first surface to define a first side of a piezo-diaphragm;

a second electrode pattern coupled to a portion of said second surface to define a second side of said piezo-diaphragm, wherein said first electrode pattern and said second electrode pattern are configured to produce an electric field into said ferroelectric material when said ferroelectric material experiences deflection in a direction substantially perpendicular to said first surface and said second surface, said electric field originating at a region of said ferroelectric material between said first electrode pattern and said second electrode pattern, said electric field extending radially outward from said region of said ferroelectric material and substantially parallel to said first surface and said second surface, whereby a current induced in each of said first electrode pattern and said second electrode pattern is indicative of said deflection; and means, coupled to said piezo-diaphragm, for attaching said piezo-diaphragm about its perimeter to a housing, said means for attaching comprising a dielectric material, said means for attaching encasing said ferroelectric material with said first electrode pattern and second electrode pattern thereto.

20. A sonic sensor as in claim 19 wherein said piezo-diaphragm has a general shape selected from the group of shapes consisting of circles, triangles and polygons.

21. A sonic sensor as in claim 19 wherein said first electrode pattern and said second electrode pattern are mirror images of one another.

22. A sonic sensor as in claim 21 wherein each of said first electrode pattern and said second electrode pattern comprises at least two independent electrodes having opposite polarity and arranged in an alternating sequence as they extend radially outward from said region of said ferroelectric material, said alternating sequence being defined with respect to a cross-sectional view of said piezo-diaphragm.

23. A sonic sensor as in claim 19 wherein said first electrode pattern and said second electrode pattern are staggered with respect to one another along a direction substantially perpendicular to said substantially parallel planes, and wherein said first electrode pattern is energized with a voltage of a first polarity and said second electrode pattern is energized with a voltage of a second polarity that is opposite that of said first polarity.

24. A sonic sensor as in claim 19 further comprising a shaped electrode electrically coupled to a center portion each of said first electrode pattern and said second electrode pattern, wherein each said center portion is aligned with one another to define a common perimeter, wherein voltage applied to said center portion of said first electrode pattern is an opposite polarity with respect to voltage applied to said center portion of said second electrode pattern, and wherein said ferroelectric material aligned with said common perimeter defines said region of said ferroelectric material at which said electric field originates.

25. A sonic sensor as in claim 19 wherein said ferroelectric material comprises a single sheet of ferroelectric material.

26. A sonic sensor as in claim 19 wherein said means for attaching comprises:

a first piece of dielectric material with said first electrode pattern coupled thereto; and a second piece of dielectric material with said second electrode pattern coupled thereto;

said first piece of dielectric material joined to said second piece of dielectric material beyond the perimeter defined by said piezo-diaphragm to thereby form said means for attaching.

27. A sonic sensor as in claim 19 wherein said ferroelectric material comprises a ceramic piezoelectric material.

* * * * *